US012812901B2

(12) United States Patent
Tzou et al.

(10) Patent No.: US 12,812,901 B2
(45) Date of Patent: Nov. 24, 2026

(54) SEMICONDUCTOR DEVICE AND METHODS FOR FORMING THE SAME

(71) Applicant: Vanguard International Semiconductor Corporation, Hsinchu (TW)

(72) Inventors: Chen-Dong Tzou, Taipei City (TW); Chia-Hao Lee, Zhubei City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 343 days.

(21) Appl. No.: 18/619,810

(22) Filed: Mar. 28, 2024

(65) Prior Publication Data

US 2025/0311287 A1 Oct. 2, 2025

(51) Int. Cl.

*H10D 30/66* (2025.01)
*H10D 30/01* (2025.01)
*H10D 62/10* (2025.01)

(52) U.S. Cl.

CPC ....... *H10D 30/668* (2025.01); *H10D 30/0297* (2025.01); *H10D 62/102* (2025.01); *H10D 62/126* (2025.01)

(58) Field of Classification Search

CPC ............. H10D 30/668; H10D 30/0297; H10D 62/102; H10D 62/126; H10D 30/0295;

(Continued)

(56) References Cited

U.S. PATENT DOCUMENTS

2009/0096021 A1* 4/2009 Loechelt ............ H10D 30/0293 257/341
2010/0140694 A1* 6/2010 Tu ...................... H10D 30/0293 438/270

(Continued)

FOREIGN PATENT DOCUMENTS

TW 201330250 A1 7/2013
TW 202406139 A 2/2024
TW I831561 B 2/2024

OTHER PUBLICATIONS

Taiwanese Office Action and Search Report for Taiwanese Application No. 113108145, dated Feb. 7, 2025.

*Primary Examiner* — Mark W Tornow
(74) *Attorney, Agent, or Firm* — Birch, Stewart, Kolasch & Birch, LLP

(57) ABSTRACT

A semiconductor device includes a substrate of the first conductivity type, an epitaxial layer of the first conductivity type, doping portions of the second conductivity type, a trench structure, a well region of the second conductivity type and a gate structure on the epitaxial layer and over the well region. The epitaxial layer includes the first epitaxial portion on the substrate and the second epitaxial portion on the first epitaxial portion. The doping portions are formed in the first epitaxial portion. The trench structure is formed in the second epitaxial portion. The trench structure extends from the top surface of the second epitaxial portion. The trench structure is in contact with one of the doping portions. The first sidewall of the well region is in contact with the trench structure. The second sidewall and the bottom surface of the well region are in contact with the second epitaxial portion.

28 Claims, 7 Drawing Sheets

(58) Field of Classification Search
CPC .... H10D 30/66; H10D 62/111; H10D 62/127; H10D 62/393; H10D 64/117; H10D 62/107
See application file for complete search history.

(56) References Cited

U.S. PATENT DOCUMENTS

| | | | | |
|---|---|---|---|---|
| 2013/0175607 | A1* | 7/2013 | Lee | H10D 30/0291 257/329 |
| 2015/0372131 | A1* | 12/2015 | Hébert | H10D 30/668 257/330 |
| 2016/0351658 | A1 | 12/2016 | Hébert | |
| 2020/0350400 | A1* | 11/2020 | Lee | H10D 30/021 |

* cited by examiner

SEMICONDUCTOR DEVICE AND METHODS FOR FORMING THE SAME

BACKGROUND

Technical Field

The disclosure relates to a semiconductor device and methods for forming the same, and, in particular, to a semiconductor device with decreased on-resistance and improved reliability and methods for forming the same.

Description of the Related Art

The integration density of different electronic components is being continuously improved in the semiconductor industry. Continuously decreasing the minimum size of components allows more and more components to be integrated into a given area. For example, vertical-diffused metal oxide semiconductor (VDMOS) devices are designed to have a vertical structure to reduce the cell pitch and increase their functional density. In a VDMOS device, the back of the chip serves as a drain, while the sources and gates of various transistors are formed on the front of the chip. Accordingly, the flow of the driving current of a planar semiconductor device is in the horizontal direction, while the flow of the driving current of a VDMOS device is in the vertical direction, so that the VDMOS device can achieve a high withstand voltage and a low on-resistance. Thus, VDMOS devices are widely applied in power switch components.

As the requirements for the electrical performance of semiconductor devices continuously increases, the types and functions of the integrated devices of semiconductor devices must also increase to meet these application requirements. However, as the functional density of semiconductor devices continuously increases, the complexity of processing and manufacturing components of these semiconductor devices also increases. The trade-off performance between some electrical characteristics of a semiconductor device needs to be considered. For example, a conductive trench of the aforementioned vertical-type semiconductor device, which is formed in an epitaxial layer, functions as a field plate. However, the critical dimensions of the conductive trench, such as the width of the trench opening, the depth of the conductive trench and the thickness of the insulation layers on the conductive layer in the trench, need to be increased as the device operating voltage increases, in order to be suitable for higher voltage device operations. The increase of the critical dimensions will increase the cell pitch between semiconductor units, thereby reducing the density of the semiconductor units of the device. Therefore, although existing semiconductor devices and methods for forming the same have generally been adequate for their intended purposes, they have not been entirely satisfactory in all respects.

BRIEF SUMMARY

Some embodiments of the present disclosure provide semiconductor devices. A semiconductor device of the embodiments includes a substrate that has the first conductivity type and an epitaxial layer on the substrate. The epitaxial layer has the first conductivity type. The epitaxial layer includes a first epitaxial portion on the substrate and a second epitaxial portion on the first epitaxial portion. The semiconductor device further includes doping portions that are formed in the first epitaxial portion. The doping portions have the second conductivity type. The semiconductor device further includes a trench structure that is formed in the second epitaxial portion. The trench structure extends from the top surface of the second epitaxial portion into the second epitaxial portion. The trench structure includes a conductive portion and an insulating layer that covers the sidewalls and the bottom of the conductive portion. The insulating layer of the trench structure is in contact with one of the doping portions. The semiconductor device further includes a well region that extends from the top surface of the second epitaxial portion into the second epitaxial portion. The well region has the second conductivity type, and the first sidewall of the well region is in contact with the trench structure. The bottom surface of the well region and the second sidewall that is opposite to the first sidewall of the well region are in contact with the second epitaxial portion. The semiconductor device further includes a gate structure that is formed on the top surface of the second epitaxial portion and over the well region.

Some embodiments of the present disclosure provide methods for forming a semiconductor device. A method for forming a semiconductor device includes providing a substrate that has the first conductivity type, and forming a first epitaxial portion on the substrate. The first epitaxial portion has the first conductivity type. The method further includes forming doping portions in the first epitaxial portion and forming a second epitaxial portion on the first epitaxial portion. The doping portions have a second conductivity type. The doping portions extend downward from the top surface of the first epitaxial portion into the first epitaxial portion. The second epitaxial portion has the first conductivity type. The first epitaxial portion and the second epitaxial portion form an epitaxial layer. The method further includes forming a trench structure in the second epitaxial portion and forming a well region that extends downwardly from the top surface of the second epitaxial portion into the second epitaxial portion. The trench structure extends downward from the top surface of the second epitaxial portion and is in contact with one of the doping portions. The trench structure includes a conductive portion and an insulating layer that covers sidewalls and the bottom of the conductive portion. The insulating layer is in direct contact with said doping portion. The well region has the second conductivity type. The first sidewall of the well region is in contact with the trench structure. The bottom surface and the second sidewall of the well region that is opposite to the first sidewall are in contact with the second epitaxial portion. The method further includes forming a gate structure on the top surface of the second epitaxial portion. The gate structure is positioned above the well region, in accordance with some embodiments of the present disclosure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

In addition, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented, and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor devices and methods for forming the same. According to the embodiments, the semiconductor devices that are suitable for high-voltage operation can be formed by incorporating a device design for lower voltage operation. In addition, the semiconductor devices of the embodiments can effectively reduce the on-resistance and improve the reliability of the devices. The embodiments can be applied to metal-oxide-semiconductor (MOS) devices, such as metal-oxide-semiconductor field effect transistors (MOSFETs). In some of the embodiments described below, a MOSFET that includes a planar gate and a conductive trench structure is used to illustrate a semiconductor device.

FIG. 1A-FIG. 1G illustrate cross-sectional views of intermediate stages of a method for forming a semiconductor device, in accordance with some embodiments of the present disclosure.

Figure 1B:
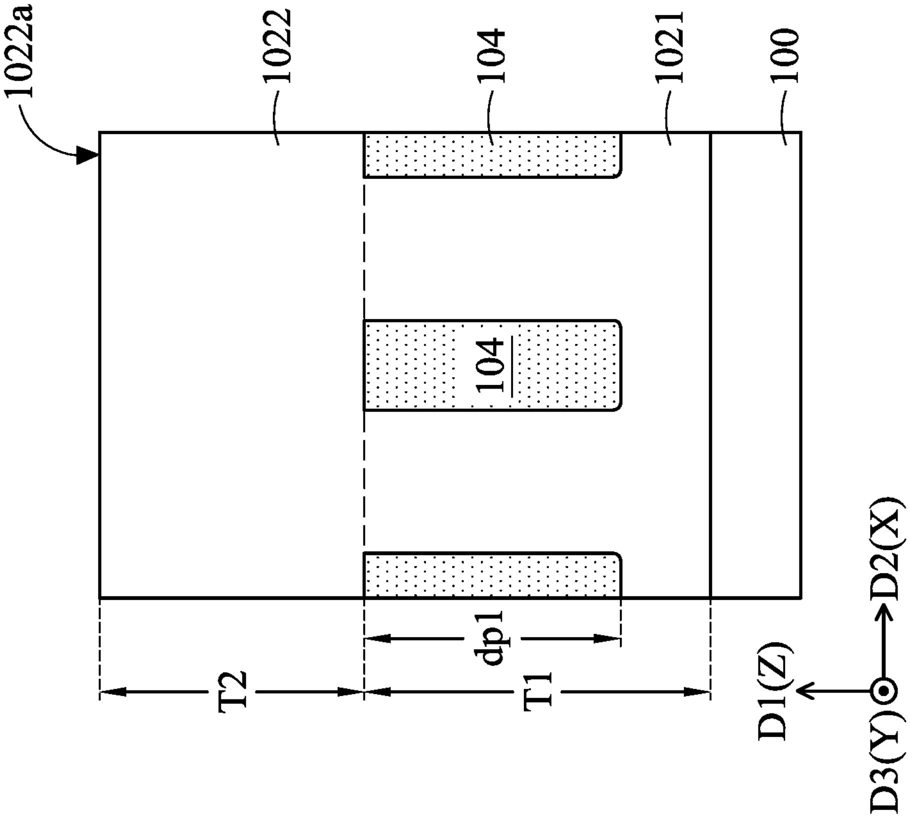
FIG. 1A-FIG. 1G illustrate cross-sectional views of intermediate stages of a method for forming a semiconductor device, in accordance with some embodiments of the present disclosure.
Figure 1A:
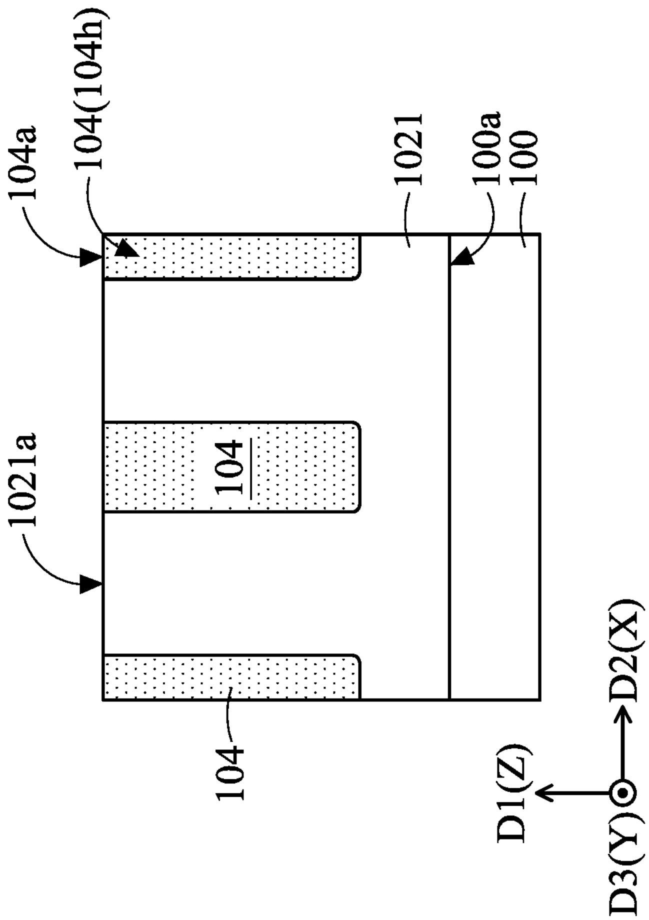

Referring to FIG. 1A, a substrate 100 that has a first conductivity type is provided according to some embodiments. In some embodiments, the substrate 100 is a bulk semiconductor substrate, such as a semiconductor wafer. For example, the substrate 100 is a silicon wafer. In some embodiments, the substrate 100 includes silicon or another elemental semiconductor material. In some other embodiments, the substrate 100 includes another elemental semiconductor material such as germanium (Ge). In some embodiments, the substrate 100 includes compound semiconductor, such as silicon carbide, gallium nitride, or another suitable material. In some embodiments, the substrate 100 includes alloy semiconductor, such as silicon germanium, silicon germanium carbide, or another suitable alloy semiconductor. In some embodiments, the substrate 100 includes several material layers that form a multilayer structure. The materials of the substrate 100 include silicon/silicon germanium, silicon/silicon carbide, or another suitable combination of the material layers.

In this exemplary embodiment, the substrate 100 is, for example, a silicon wafer that is doped with dopants of the first conductivity type. In the application of a vertical trench-gate MOSFET, the substrate 100 that has the first conductivity type can act as a drain region of the semiconductor device. In addition, in this exemplary embodiment, the first conductivity type is n-type, but the present disclosure is not limited thereto. In some other embodiments, the first conductivity type can be p-type.

In some embodiments, an epitaxial growth process is performed to form an epitaxial layer 102 on the substrate 100. During the epitaxy process, the material is grown in the first direction D1 (for example, the Z direction) to form the epitaxial layer 102. In this exemplary embodiment, formation of the epitaxial layer 102 includes two stages. After the first epitaxial portion 1021 of the epitaxial layer 102 is formed, several doping portions 104 that are separated from each other can be formed in the first epitaxial portion 1021. Then, the second epitaxial portion 1022 is formed on the first epitaxial portion 1021. The doping portions 104 and the epitaxial layer 102 have different conductivity types.

Referring to FIG. 1A, in some embodiments, an epitaxial growth process is performed on the top surface 100*a* of the substrate 100 to form the first epitaxial portion 1021 of the epitaxial layer 102. The first epitaxial portion 1021 has the first conductivity type. Next, several doping portions 104 that have the second conductivity type are formed in the first epitaxial portion 1021. The doping portions 104 extend downward from the top surface 1021*a* of the first epitaxial portion 1021 into the first epitaxial portion 1021. In some embodiments, the doping portions 104 are separated from each other in the second direction D2 (such as X direction). In addition, in some embodiments, the depths of the doping portions 104 are approximately the same in the first epitaxial portion 1021.

In addition, the substrate 100 and the first epitaxial portion 1021 of the epitaxial layer 102 have the same conductivity type, such as the first conductivity type. In this exemplary embodiment, the substrate 100 and the first epitaxial portion 1021 are n-type. The doping portions 104 and the first epitaxial portion 1021 have different conductivity types. In this exemplary embodiment, the doping portions 104 are p-type. In some embodiments, the doping concentration of the first epitaxial portion 1021 of the epitaxial layer 102 is lower than the doping concentration of the substrate 100. In some embodiments, the doping concentration of the substrate 100 is in a range of about 1E18 atoms/$cm^3$ to about 1E21 atoms/$cm^3$. The doping concentration of the first epitaxial portion 1021 may be in a range of about 1E14 atoms/$cm^3$ to about 1E16 atoms/$cm^3$. It should be noted that those numerical values are provided for illustrative purposes, and the embodiments of the present invention are not limited thereto.

In some embodiments, the doping regions include dopants of the second conductivity type (such as p-type). The doping concentration of the doping portions 104 is lower than the doping concentration of the substrate 100. In some embodiments, the doping concentration of the doping portions 104 is substantially the same as the doping concentration of the first epitaxial portion 1021. The doping concentration of the doping portions 104 may be in a range of about 1E14 atoms/$cm^3$ to about 1E16 atoms/$cm^3$. However, the numerical values are provided for illustrative purposes, and the present invention is not limited thereto.

In addition, in some embodiments, the doping portions 104 and the first epitaxial portion 1021 include the same semiconductor material. For example, the doping portions 104 and the first epitaxial portion 1021 are made of a silicon-containing material. In some embodiments, the doping portions 104 include epitaxial silicon of the second conductivity type (such as p-type).

The above-mentioned doping portions 104 may be formed using different manufacturing methods. For example, an implantation process may be performed in the first epitaxial portion 1021 to form the doping portions 104. Alternatively, an etching process may be performed to form several holes 104*h* in the first epitaxial portion 1021, and the holes 104*h* are then filled with a material of the second conductivity type to form the doping portions 104. Two applicable methods for forming the doping portions 104 are briefly described below, but the present disclosure is not particularly limited thereto.

In some embodiments, the doping portions 104 can be formed in the first epitaxial portion 1021 using a deposition process, a patterning lithography process, an etching process and an implantation process. In one exemplary embodiment, a hard mask material layer (not shown) (such as an oxide hard mask material layer) can be deposited over the top surface 1021*a* of the first epitaxial portion 1021. Next, a patterned photoresist (not shown) that has a pattern corresponding to the positions of the doping portions 104 is formed on the hard mask material layer. The hard mask material layer is etched by using the patterned photoresist to form a patterned hard mask (such as an oxide hard mask). The openings of the patterned hard mask correspond to the positions of the doping portions 104 that are formed subsequently. Then, the patterned photoresist is removed, and the patterned hard mask is left on the first epitaxial portion 1021. An implantation process is performed on the first epitaxial portion 1021 using the pattern (e.g., the openings) of the patterned hard mask, thereby forming the doping portions 104 in the first epitaxial portion 1021. Those doping portions 104 extend downward from the top surface 1021*a* of the first epitaxial portion 1021 into the first epitaxial portion 1021. Those doping portions 104 include dopants of the second conductivity type. Then, the patterned hard mask is removed. Next, a thermal drive-in process, such as a high temperature annealing process, is selectively performed to diffuse the regions of the doping portions 104 outwardly and fix the contour profiles of the doping portions 104.

In some other embodiments, positions of the doping portions 104 can be defined by a suitable lithographic patterning process, and the doping portions 104 can be formed by a suitable deposition process and a planarization process. For example, a mask (not shown) is formed on the first epitaxial portion 1021, and the mask has several openings that expose portions of the top surface 1021*a* of the first epitaxial portion 1021. In some embodiments, the mask is a patterned photoresist that is formed of a photoresist material. In some other embodiments, the mask may be a hard mask (HM) composed of an oxide layer and a nitride layer. After the mask is formed on the first epitaxial portion 1021, portions of the first epitaxial portion 1021 can be removed through the openings of the mask. For example, one or more etching processes are performed to form several holes 104*h* in the first epitaxial portion 1021. The positions of these holes 104*h* correspond to the positions of the doping portions 104 (FIG. 1A). The depth of these holes 104*h* in the first epitaxial portion 1021 (for example, in the first direction D1) is equal to the depth of the subsequently formed doping portions 104 in the first epitaxial portion 1021. In addition, in some embodiments, the aforementioned etching process includes a dry etching process, a wet etching process, a plasma etching process, a reactive ion etching process, another suitable process, or a combination of the foregoing processes. According to some embodiments, after the holes are formed in the first epitaxial portion 1021, the mask can be removed by an ashing process, a wet etching process (such as acid etching), or another acceptable and suitable removing process. Next, these holes 104*h* are filled with a material of the second conductivity type (e.g., p-type), thereby forming the doping portions 104.

In some exemplary embodiments, a p-type material (not shown) is deposited on the first epitaxial portion 1021 by using a deposition process, and the p-type material fills the holes 104. Next, excess portions of the p-type material that are above the top surface 1021*a* of the first epitaxial portion 1021 are removed, so as to expose the top surface 1021*a* of the first epitaxial portion 1021, in accordance with some embodiments. The remaining portions of the p-type material in the holes 104 are referred to as the doping portions 104. In addition, the aforementioned deposition process can be a physical vapor deposition (PVD) process, a chemical vapor deposition (CVD) process, another suitable deposition processes, or a combination of the aforementioned processes. The aforementioned planarization process is, for example, a chemical mechanical polishing (CMP) process, a mechanical polishing process, an etching process, another suitable process, or a combination of the aforementioned processes.

In addition, in some embodiments, after the doping portions 104 are formed in the first epitaxial portion 1021, the top surfaces of the doping portions 104 are substantially level with the top surface of the first epitaxial portion 1021, as shown in FIG. 1A.

Next, referring to FIG. 1B, the epitaxial growth continues in the first direction D1 (for example, the Z direction) to grow a second epitaxial portion 1022 on the top surface 1021*a* of the first epitaxial portion 1021, in accordance with some embodiments of the present disclosure. The second epitaxial portion 1022 has the first conductivity type, such as n-type. In this exemplary embodiment, the first epitaxial portion 1021 and the second epitaxial portion 1022 collectively form an epitaxial layer 102. After the second epitaxial portion 1022 is formed, the doping portions 104 are embedded in the epitaxial layer 102. As shown in FIG. 1B, the doping portions 104 are embedded in a lower portion of the epitaxial layer 102.

In some embodiments, the aforementioned epitaxial growth process can be performed by using a metal organic chemical vapor deposition (MOCVD) process, a molecular beam epitaxy (MBE) process, a hydride vapor phase epitaxy (HVPE), a liquid phase epitaxy (LPE) process, a chloride vapor phase epitaxy (Cl-VPE) process, another suitable process or a combination thereof to form the first epitaxial portion 1021 and the second epitaxial portion 1022 of the epitaxial layer 102. In the application of a semiconductor device, such as a vertical trench gate MOSFET, the epitaxial layer 102 that has the first conductivity type (such as n-type) can function as a drift region of the semiconductor device after the fabrication of transistor is completed.

In addition, the thicknesses of the first epitaxial portion 1021 and the second epitaxial portion 1022 and the depth of the doping portions 104 in the first epitaxial portion 1021 are labeled in FIG. 1B. As shown in FIG. 1B, the first epitaxial portion 1021 is deposited with a first thickness T1 in the first direction D1, and the second epitaxial portion 1022 is deposited with a second thickness T2 in the first direction D1. The doping portions 104 that are formed in the second epitaxial portion 1022 have the depth dp1 in the first direction D1 (also referred to as the first depth dp1 hereinafter). The first depth dp1 of the doping portions 104 is less than the first thickness T1 of the first epitaxial portion 1021. The first thickness T1 of the first epitaxial portion 1021 may be greater than, equal to, or less than the second thickness T2 of the second epitaxial portion 1022, depending on the electrical requirements of the semiconductor device in practical applications.

Figure 1D:
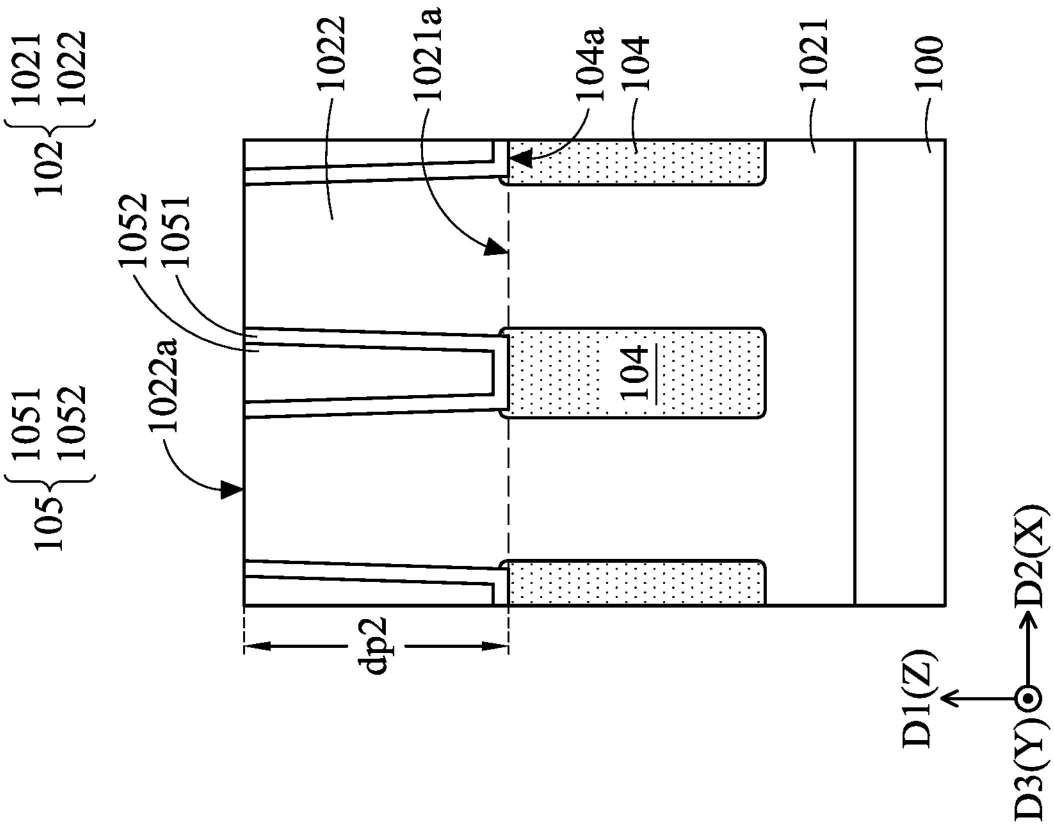
Figure 1C:
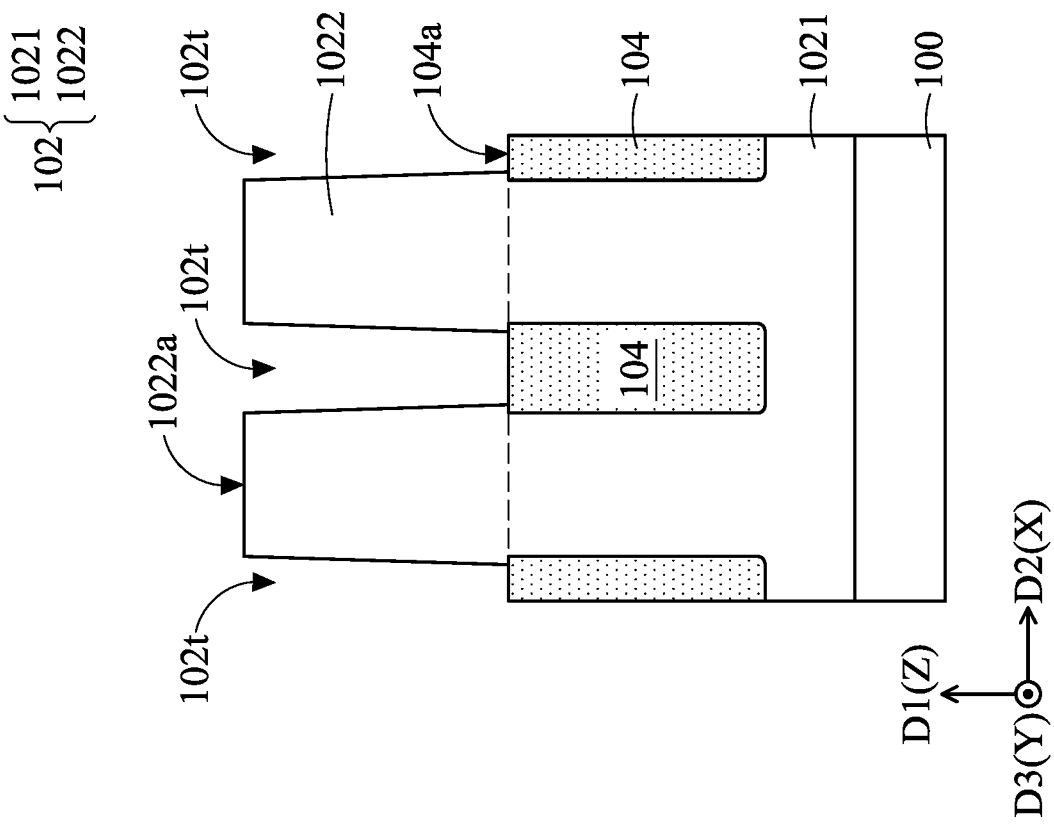

Next, as shown in FIG. 1C and FIG. 1D, several trench structures 105 are formed in the second epitaxial portion 1022, in accordance with some embodiments of the present disclosure.

Referring to FIG. 1C, portions of the second epitaxial portion 1022 are removed to form several trenches 102*t*. These trenches 102*t* are, for example, separated from each other by a distance in the second direction D2, and extend in the third direction D3. In addition, in some embodiments, the trenches 102*t* are formed on the respective doping portions 104, thereby exposing at least portions of the top surface 104*a* of the doping portions 104. In addition, in some embodiments, the depth (e.g., in the first direction D1) of these trenches 102*t* in the second epitaxial portion 1022 is equal to the depth (e.g., in the first direction D1) of the subsequently formed trench structures 105 in the second epitaxial portion 1022.

These trenches 102*t* may be formed by a deposition process, a lithographic patterning process and an etching process, in accordance with some embodiments of the present disclosure. For example, a hard mask material layer (not shown) may be deposited over the second epitaxial portion 1022, and a patterned photoresist (not shown) may be formed on the hard mask material layer. The hard mask material layer can be a single-layer structure or a multilayer structure. The patterned photoresist layer has a pattern of openings that correspond to the positions of trenches 102*t*. Next, the hard mask material layer and the second epitaxial portion 1022 are sequentially etched by one or more etching processes through the patterned photoresist layer to remove portions of the second epitaxial portion 1022, thereby forming the trenches 102*t*. In some embodiments, the aforementioned etching processes includes a dry etching process, a wet etching process, a plasma etching process, a reactive ion etching process, another suitable process, or a combination of the foregoing processes. After the trenches 102*t* are formed, the patterned photoresist layer is removed. Next, a cleaning process is performed on the structure to remove residues. In addition, the above-mentioned hard mask material layer can be removed or remained on the second epitaxial portion 1022. To simplify the drawings, the hard mask material layer is removed in this exemplary embodiment for the sake of simplicity and clarity.

Next, referring to FIG. 1D, in some embodiments, several trench structures 105 are formed in the respective trenches 102*t*. Each of the trench structures 105 is in contact with the underlying doped portion 104. Each of the trench structures 105 includes, for example, an insulating layer 1051 and a conductive portion 1052. The insulating layer 1051 covers the sidewalls and bottom of the conductive portion 1052.

In addition, as shown in FIG. 1D, each of the trench structures 105 in the second epitaxial portion 1022 may be separated from each other by a distance in the second direction D2 and extend in the third direction D3. The insulating layer 1051 of each trench structure 105 is in direct contact (for example, in physical contact) with the doping portions 104. Therefore, the conductive portion 1052 of the trench structure 105 is electrically isolated from the underlying doping portion 104 by the insulating layer 1051, in accordance with some embodiments of the present disclosure.

In some embodiments, the insulating layer 1051 may be silicon oxide, another suitable semiconductor oxide material or a combination of the foregoing materials. In some embodiments, an insulating material can be conformably formed on the sidewalls and the bottom surfaces of the trenches 102*t* and on the top surface 1022*a* of the second epitaxial portion 1022 by an oxidation process. This insulating material can also be referred to as a shield insulating material. The above-mentioned oxidation process is, for example, thermal oxidation, radical oxidation, or another suitable process. In addition, in some embodiments, a thermal process can be selectively performed on the insulating material to increase the density of the insulating material. In some embodiments, the aforementioned thermal process may be a rapid thermal annealing (RTA) process.

In some other embodiments, an insulating material may be deposited on the sidewalls and the bottom surface of the trenches 102*t* and on the top surface 1022*a* of the second epitaxial portion 1022 by a deposition process. The aforementioned deposition process is, for example, a conformal deposition process, and may be a physical vapor deposition (PVD) process, a chemical vapor deposition (CVD) process, an atomic layer deposition (ALD) process, another suitable deposition process, or a combination of the aforementioned processes.

Next, in some embodiments, a conductive material (not shown) can be deposited on top of the insulating material by a deposition process, and the conductive material fills the remaining space in the trenches 102*t*. A thermal process, such as an annealing process, can be selectively performed on the conductive material. In some embodiments, the conductive material may be a single-layer or a multilayer structure. The conductive material may include, for example, polysilicon, another suitable material, or a combination of the foregoing materials. In some embodiments, the deposition process of the conductive material may be a physical vapor deposition (PVD) process, a chemical vapor deposition (CVD) process, another suitable process, or a combination of the foregoing processes.

Next, portions of the insulating material and portions of the conductive material are removed to form the trench structures 105 as shown in FIG. 1D. In some exemplary embodiments, the step of removing the portions of the insulating material and the portions of the conductive material may (but is not limited to) include a planarization process. The planarization process is performed to remove an excess portion of the conductive material that is formed above the top surface 1022*a* of the second epitaxial portion 1022 and remove an excess portion of the insulating material to expose the top surface 1022*a* of the second epitaxial portion 1022. The above-mentioned planarization process is, for example, a chemical mechanical polishing (CMP) process, a mechanical polishing process, an etching process, another suitable process, or a combination of the foregoing processes.

After the above-mentioned removal step, the remaining portions of the insulating material are referred to as the insulating layers 1051, and the remaining portions of the conductive material are referred to as the conductive portions 1052. The conductive portions 1052 and the second epitaxial portion 1022 are separated by the insulating layers 1051. In some exemplary embodiments, after the planarization process is performed, the conductive portions 1052 are formed on the respective insulating layers 1051, and the top surfaces of the conductive portions 1052 and the top surfaces of the insulating layers 1051 are substantially coplanar with the top surface 1022*a* of the second epitaxial portion 1022.

In addition, in some embodiments, the trench structures 105 that are formed in the second epitaxial portion 1022 have a depth of dp2 in the first direction D1 (hereinafter may also be referred to as the second depth dp2). To meet the electrical requirements of the applied semiconductor device, the second depth dp2 of the trench structures 105 can be adjusted and determined in conjunction with the first depth dp1 of the underlying doping portions 104.

In addition, the critical width (e.g., the maximum width) of the bottoms of the trench structures 105 is less than the critical width (e.g., the maximum width) of the top surfaces 104*a* of the doping portions 104 that are in contact with the respective trench structures 105, in accordance with some embodiments of the present disclosure. As shown in FIG. 1D, the width of the bottom surface of the trench structure 105 in the second direction D2 may be less than the width of the top surface 104*a* of the underlying doping portion 104 in the second direction D2. However, the disclosure is not limited thereto.

In some embodiments, when the semiconductor device is operated at high voltage, a region of the first epitaxial portion 1021 which carriers flow to can be depleted by the super junctions between the doping portions 104 and the first epitaxial portion 1021 of different conductivity types. Therefore, the second epitaxial portion 1022 in the upper of the epitaxial layer 102 may include a device design that is originally suitable for lower voltage operation, including a smaller cell pitch and a narrower trench structure 105. Therefore, a semiconductor device suitable for high-voltage operation can be implemented by providing a combination of the doping portions 104 at lower positions and the trench structures 105 at upper positions and in contact with the doping portions 104, in accordance with some embodiments of the present disclosure.

Figure 1F:
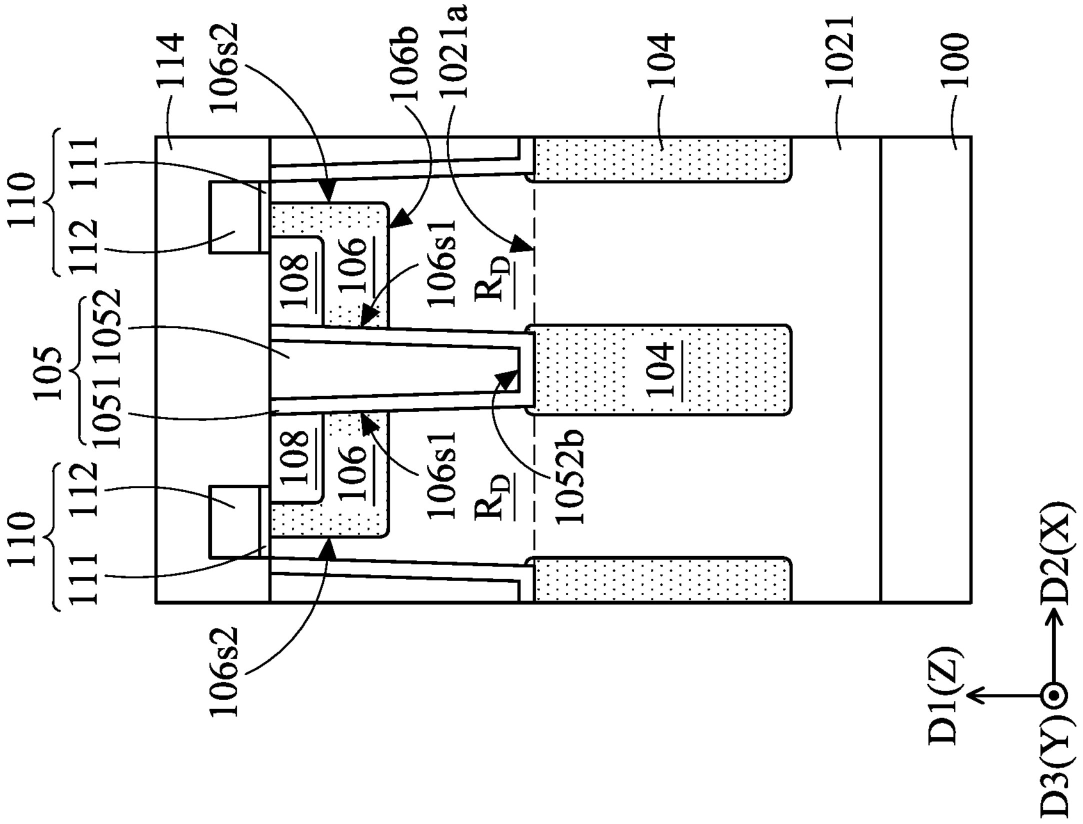
Figure 1E:
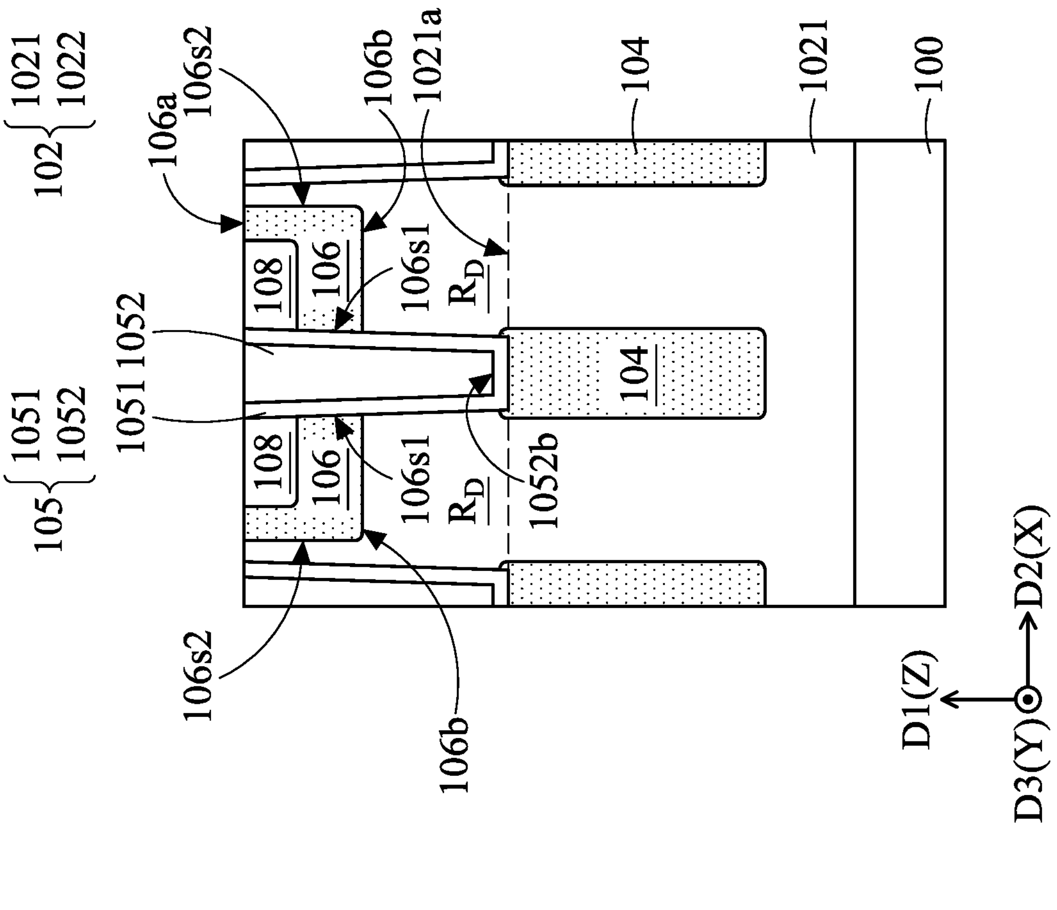

Next, referring to FIG. 1E, in some embodiments, several well regions 106 are formed in the second epitaxial portion 1022. The well regions 106 and the second epitaxial portion 1022 have different conductivity types. For example, the well regions 106 have the second conductivity type. In this exemplary embodiment, the well regions 106 are p-type, which can also be referred to as p-body regions. In addition, the depth of the trench structures 105 in the second epitaxial portion 1022 (for example, the depth dp2 in the first direction D1) is greater than the depth of the well region 106 in the second epitaxial portion 1022 (for example, the depth in the first direction D1). More specifically, the bottom surfaces of the trench structures 105 are closer to the substrate 100 than the bottom surfaces of the well regions 106. In some embodiments, the doping concentration of each of the well regions 106 is in a range of about 1E16 atoms/cm$^3$ to about 1E18 atoms/cm$^3$. According to some embodiments, the surface of each of the well regions 106 functions as a channel region of a semiconductor device.

In some embodiments, the bottom surfaces 1052*b* of the conductive portions 1052 of the trench structures 105 are lower than the bottom surfaces 106*b* of the well regions 106. The bottom surfaces 1052*b* of the conductive portions 1052 are higher than the top surfaces 1021*a* of the first epitaxial portions 1021.

It should be noted that a symmetric configuration of the components of each semiconductor unit (such as a transistor) is depicted for illustrating the exemplary embodiment. For example, relevant components (that include the well regions 106, the first heavily doped portions 108, the gate structures 100, the contact plugs 116 and other components) are formed symmetrically on opposite sides of each of the trench structures 105. However, the present disclosure is not limited thereto. In some other embodiments, the design provided in the above-mentioned embodiment, including the super junctions formed by the doping portions 104 in the first epitaxial portion 1021 and a combination of the doping portions 104 and the trench structures 105 in the second epitaxial portion 1022, can also be applied to the semiconductor units with asymmetrically configured components. Relevant components on one side of each of the trench structures 105 are described below to simplify the description.

In some embodiments, one side of the well region 106 is in contact with the trench structure 105, and the second epitaxial portion 1022 of the epitaxial layer 102 covers the other side and the bottom surface of the well region 106, in accordance with some embodiments of the present disclosure. For example, the first sidewall 106*s*1 of one of the well regions 106 is in contact with the corresponding trench structure 105. In other words, after the well regions 106 are formed, one side of each of the trench structures 105 extends in the epitaxial layer 102 along the first sidewall 106*s*1 of the well region 106, as shown in FIG. 1E.

In some embodiments, the well regions 106 shown in FIG. 1D can be formed in the second epitaxial portion 1022 by doping from the top surface 1022*a* of the second epitaxial portion 1022 using a deposition process, a patterning lithography process, an etching process and an implantation process. It should be noted that the cross-sectional view in FIG. 1D cannot show the three-dimensional shape of the well regions 106, but each of the well regions 106 is a doping region that extends in the first direction D1, the second direction D2 and the third direction D3.

In addition, according to some embodiments, the epitaxial portions that are outside and below the well regions 106 are collectively referred to as a drift region $R_D$. The drift region $R_D$ has the first conductivity type, for example, n-type. The drift region $R_D$ is in contact with the second sidewalls 106*s*2 and the bottom surfaces 106*b* of the well regions 106, as shown in FIG. 1E. In this exemplary embodiment, the well regions 106 and the drift region RD are in direct contact with the trench structures 105. The well regions 106 and the drift region $R_D$ are separated from the conductive portions 1052 by the insulating layers 1051 of the trench structures 105. In the processes of some embodiments, viewed from the top of the second epitaxial portions 1022, a mask that defines the well regions 106 (e.g., extending in the second direction D2 and the third direction D3; not shown) and another mask that defines the trench structures 105 (e.g., extending in the second direction D2 and the third direction D3; not shown) partially overlap in the second direction D2. Accordingly, the subsequently formed well regions 106 are in contact with the one side of the respective trench structures 105.

Next, an ion implantation process can be performed on the top surfaces 106*a* of the well regions 106 (that is, the top surface 10*s*2*a* of the second epitaxial portion 102*s*) to form the first heavily doped regions 108 in the well regions 106, in accordance with some embodiments of the present disclosure. In some embodiments, one side of each of the first heavily doped portions 108 is in contact with the adjacent trench structure 105. For example, each of the first heavily doped portions 108 is in directly contact with the insulating layer 1051 of the adjacent trench structure 105.

In one exemplary embodiment, the first heavily doped portions 108 and the epitaxial layer 102 have the same conductivity type, such as the first conductivity type. In this exemplary embodiment, the first heavily doped portions 108 are n-type. In some embodiments, the doping concentration of the first heavily doped portions 108 is greater than the doping concentration of the second epitaxial portion 1022. In some embodiments, the doping concentration of the first heavily doped portions 108 is in a range of about 1E18 atoms/cm$^3$ to about 1E21 atoms/cm$^3$.

In some embodiments, the first heavily doped portions 108 can be formed in the well regions 106 by doping from the top surface 1022*a* of the second epitaxial portion 102*s* using a deposition process, a patterning lithography process, an etching process and an implantation process. In one exemplary embodiment, an oxide hard mask material layer (not shown) can be deposited over the top surface 1022*a* of the second epitaxial portion 1022, and then a patterned photoresist that has a pattern corresponding to the positions of the first heavily doped portions 108 is formed on the oxide hard mask material layer. The oxide hard mask material layer is etched by using the patterned PR to form an oxide hard mask. The patterned PR is removed, and the epitaxial layer 102 is doped through the oxide hard mask to form the first heavily doped portions 108 in the well regions 106. Then, the oxide hard mask is removed.

Next, referring to FIG. 1F, the planar gate structures 110 are formed on the top surface 1022*a* of the second epitaxial portion 1022, in accordance with some embodiments of the present disclosure. These gate structures 110 correspond to the underlying well regions 106. Specifically, each of the gate structures 110 is formed over the corresponding well region 106, the first heavily doped portion 108 in the well region 106 and a portion of the drift region $R_D$.

In some embodiments, each of the gate structures 110 includes a gate dielectric layer 111 and a gate electrode 112 over the gate dielectric layer 111. The gate dielectric layer 111 may include silicon oxide or another suitable dielectric material. The gate electrode 112 may include polysilicon or another suitable conductive material. A dielectric material layer (not shown) can be formed on the epitaxial layer 102 by using a deposition process (such as a physical vapor deposition (PVD) process, a chemical vapor deposition (CVD) process, an atomic layer deposition (ALD) process) or a thermal oxidation process. Then, a conductive material (not shown) is deposited on the dielectric material layer. The deposition process may be a physical vapor deposition (PVD) process, a chemical vapor deposition (CVD) process, another suitable process, or a combination of the aforementioned processes. Next, the aforementioned dielectric material layer and the conductive material can be patterned by using a lithography process and an etching process to form the gate dielectric layer 111 and the gate electrode 112 of each of the gate structures 110.

As shown in FIG. 1F, after the gate structures 110 are formed, an interlayer dielectric (ILD) layer 114 is formed over the epitaxial layer 102, in accordance with some embodiments of the present disclosure. More specifically, the interlayer dielectric layer 114 is formed on the top surface 1022*a* of the second epitaxial layer 1022 and covers the gate structures 110, the first heavily doped portions 108 and the trench structures 105.

In some embodiments, the interlayer dielectric layer 114 may be silicon oxide, or another suitable low-k dielectric material, or a combination of the aforementioned materials. In some embodiments, the material of the interlayer dielectric layer 114 is different from the material of the insulating layers 1051 of the trench structures 105. In some other embodiments, the material of the interlayer dielectric layer 114 is the same as the material of the insulating layers 1051 of the trench structures 105. In addition, the interlayer dielectric layer 114 can be deposited on the epitaxial layer 102 by using a deposition process. In some embodiments, the above-mentioned deposition process for forming the interlayer dielectric layer 114 can be a physical vapor deposition (PVD) process, a chemical vapor deposition (CVD) process, another suitable process, or a combination of the aforementioned processes.

Figure 1G:
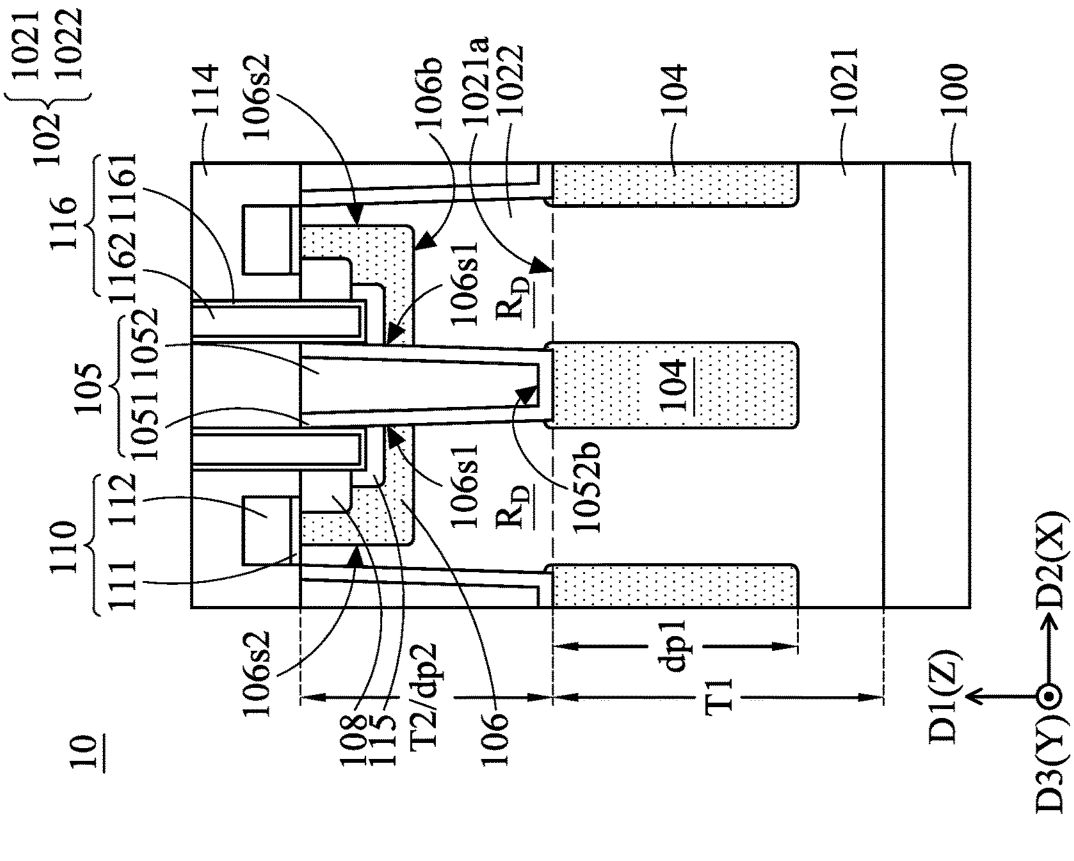

Next, referring to FIG. 1G, several contact plugs 116 are formed in the interlayer dielectric layer 114, in accordance with some embodiments of the present disclosure. The contact plugs 116 are electrically connected to the respective source regions of the semiconductor device. One of applicable processes for forming contact plugs 116 is provided below for illustration.

In some embodiments, portions of the interlayer dielectric layer 114, portions of the first heavily doped portions 108, and portions of the well regions 106 are removed to form several contact holes (not shown) in which the contact plugs 116 are disposed. Each of the contact holes are positioned between the gate structure 110 and the trench structure 105. In addition, each of the bottoms of the contact holes exposes the corresponding well regions 106.

The contact holes can be formed by using a lithography patterning process and an etching process, in accordance with some embodiments of the present disclosure. For example, after the interlayer dielectric layer 114 is deposited on the second epitaxial portion 1022, one or more etching processes can be performed to remove portions of the interlayer dielectric layer 114, portions of the first heavily doped portions 108 and portions of the well regions 106 to form the contact holes. In some embodiments, the aforementioned lithographic patterning process includes photoresist coating (e.g., spin-on coating), soft baking, mask alignment, exposure, post-exposure baking, developing the photoresist, rinsing and drying (e.g., hard baking), another suitable process or a combination of the aforementioned processes. In addition, in some embodiments, the aforementioned etching process includes a dry etching process, a wet etching process, a plasma etching process, a reactive ion etching process, another suitable process, or a combination of the aforementioned processes.

After the contact holes are formed, the remaining portions of the first heavily doped portions 108 each in the corresponding well regions 106 can be referred to as source regions of a semiconductor device, in accordance with some embodiments of the present disclosure.

Next, after the contact holes are formed in the interlayer dielectric layer 114, the second heavily doped portions 115 can be formed in the well regions 106 through the bottom portions of the contact holes by using an implantation process, in accordance with some embodiments of the present disclosure. In some embodiments, the second heavily doped portions 115 and the well regions 106 have the same conductivity type, such as the second conductivity type. In this exemplary embodiment, the second heavily doped portions 115 are p-type.

In some embodiments, the doping concentration of the second heavily doped portions 115 is greater than the doping concentration of the well regions 106. In addition, in some embodiments, the doping concentration of the doping portions 104 in the first epitaxial portion 1021 is lower than the doping concentration of the second heavily doped portions 115. In some embodiments, the doping concentration of the second heavily doped portions 115 is in a range of about 1E18 atoms/$cm^3$ to about 1E21 atoms/$cm^3$.

In some embodiments, the second heavily doped portions 115 each are disposed around the bottom portions of the contact holes. Those second heavily doped portions 115 are positioned adjacent to the corresponding trench structures 105 and the first heavily doped portions 108. For example, the second heavily doped portions 115 are positioned under the first heavily doped portions 108. In this exemplary embodiment, one side of each of the second heavily doped portions 115 is in contact (such as in physical contact) with the adjacent trench structure 105. For example, each of the second heavily doped portions 115 is in direct contact with the insulating layer 1051 of the adjacent trench structure 105. In a semiconductor device, good ohmic contact between the well regions 106 and the subsequently formed contact plugs 116 in the contact holes can be achieved by forming the second heavily doped portions 115, in accordance with some embodiments of the present disclosure.

Next, several contact plugs 116 are formed in the contact holes, in accordance with some embodiments of the present disclosure. Each of the contact plugs 116 is positioned between the gate structure 110 and the trench structure 105 in the second direction D2. In some embodiments, the contact plugs 116 are electrically connected to the well regions 106 and the first heavily doped portions 108. In addition, the bottoms of the contact plugs 116 are in contact with the second heavily doped portions 115. In this exemplary embodiment, better electrical connection between the contact plugs 116 and the well regions 106 can be achieved through the second heavily doped portions 115. In an embodiment where the first heavily doped portions 108 function as the source regions of the semiconductor device 10, the contact plugs 116 can be referred to as source contacts.

It should be noted that the contact plugs 116 are in direct contact with the adjacent trench structure 105, as shown in FIG. 1G. That is, there is no epitaxial portion of the drift region $R_D$ between the contact plug 116 and the adjacent trench structure 105 (in the second direction D2), in accordance with some embodiments of the present disclosure. However, the present disclosure is not limited thereto. In some other embodiments, each of the contact plugs 116 can be separated from the adjacent trench structure 105. That is, a portion of each of the first heavily doped portions 108 may be remained between the contact plug 116 and the adjacent trench structure 105 (in the second direction D2).

In some embodiments, each of the contact plugs 116 includes a contact barrier layer 1161 and a contact conductive layer 1162. The contact barrier layer 1161 is formed on the sidewall and the bottom portion of each of the contact holes as a barrier liner. The contact conductive layer 1162 fills up the remaining space in the contact hole. In this exemplary embodiment, the top surfaces of the contact plugs 116 (including the top surfaces of the contact barrier layers 1161 and the top surfaces of the contact conductive layers 1162) are substantially level with the top surface of the interlayer dielectric layer 114, as shown in FIG. 1G.

In some exemplary embodiments, a barrier material (not shown) can be formed on the interlayer dielectric layer 114 by using a deposition process, and the barrier material is isotropically deposited in the contact holes. Then, a conductive material (not shown) is deposited on the barrier material layer, and the conductive material fills up the remaining space in the contact holes. Next, in some embodiments, the excess portions of the conductive material and barrier material that are above the top surface of the interlayer dielectric layer 114 are removed, such as by etching or another suitable method, to form the contact barrier layers 1161 and the contact conductive layers 1162 in the contact holes.

In some embodiments, the material of the contact barrier layers 1161 includes titanium (Ti), titanium nitride (TiN), tantalum (Ta), tantalum nitride (TaN), cobalt (Co), cobalt tungsten phosphorus compound (CoWP), ruthenium (Ru), aluminum oxide ($Al_2O_3$), magnesium oxide (MgO), aluminum nitride (AlN), tantalum pentoxide ($Ta_2O_5$), silicon dioxide ($SiO_2$), hafnium dioxide ($HfO_2$), zirconium dioxide ($ZrO_2$), magnesium fluoride ($MgF_2$), calcium fluoride ($CaF_2$), another suitable barrier material, or a combination of the aforementioned materials. In some embodiments, the contact barrier layers 1161 can be formed by a chemical vapor deposition (CVD) process, an atomic layer deposition (ALD) process, a physical vapor deposition (PVD) process, another suitable process, or a combination of the foregoing processes.

In some embodiments, the contact conductive layer 1162 is a single-layer structure or a multilayer structure that includes one or more conductive materials. In some embodiments, the material of the contact conductive layers 1162 includes tungsten (W), aluminum (Al), copper (Cu), titanium (Ti), tantalum (Ta), titanium nitride (TiN), tantalum nitride (TaN), nickel silicide (NiSi), cobalt silicide (CoSi), tantalum carbide (TaC), tantalum silicon nitride (TaSiN), tantalum carbide nitride (TaCN), titanium aluminide (TiAl), titanium aluminide nitride (TiAlN), another suitable metal, or a combination of the foregoing materials. In addition, the aforementioned conductive material can be formed by using a chemical vapor deposition (CVD) process, an atomic layer deposition (ALD) process, a physical vapor deposition (PVD) process, another suitable process, or a combination of the foregoing processes, in accordance with some embodiments of the present disclosure.

Next, after the contact plugs 116 are formed, the subsequent processes for forming other components are performed. According to some embodiments, a metal layer (not shown) is formed over the interlayer dielectric layer 114 and the contact plugs 116. The metal layer covers the contact plugs 116 and is in physical and electrical contact with the contact plug 116. Therefore, the metal layer is electrically connected to the first heavily doped portions 108, the second heavily doped portions 115 and the well regions 106 through the contact plugs 116, in accordance with some embodiments of the present disclosure.

In some embodiments, the metal layer includes copper, silver, gold, aluminum, tungsten, another suitable metal material, or a combination of the aforementioned materials. In some embodiments, the metal layer and the contact plug 116 are formed of the same material(s). In some other embodiments, the material of the metal layer is different from the material of the contact plug 116. The metal layer can be formed on the contact plugs 116 by a deposition process, in accordance with some embodiments of the present disclosure. The deposition process may include a physical vapor deposition (PVD) process, a chemical vapor deposition (CVD) process, another suitable process, or a combination of the foregoing processes. The metal layer can be used as the top metal of the semiconductor device 19 for electrically connecting to the heavily doped regions 108 that are the source regions of the semiconductor device 10, in accordance with some embodiments of the present disclosure. Thus, the metal layer can also be referred to as a source metal layer. In some embodiments, after the metal layer is formed, the fabrication of a semiconductor device 10 is completed.

According to the embodiments, the doping portions 104 have a certain depth in the first epitaxial portion 1021. For example, in some embodiments, the ratio of the first depth dp1 of the doping portions 104 in the first epitaxial portion 1021 to the first thickness T1 of the first epitaxial portion 1021 is in a range of about 0.4 to about 0.9. In some embodiments, the ratio of the first depth dp1 to the first thickness T1 is in a range of about 0.5 to about 0.8, or in another suitable range.

In addition, according to the embodiments, the ratio of the depth of the doping portions 104 to the depth of the trench structures 105 reaches a certain numerical value. For example, in some embodiments, the ratio of the first depth dp1 of the doping portions 104 in the first epitaxial portion 1021 to the second depth dp2 of the trench structures 105 in the second epitaxial portion 1022 is in a range of about 0.4 to about 2.0. The ratio of the first depth dp1 to the second depth dp2 may be in a range of about 0.5 to about 1.5, or in a range of about 0.7 to about 1.3, or in a range of about 0.8 to about 1.2, or in another suitable range.

In addition, the first depth dp1 of the doping portions 104 of the embodiments may be greater than, equal to, or less than the second depth dp2 of the trench structures 105, depending on the electrical requirements of the semiconductor devices in practical applications. If the first depth dp1 is greater than the second depth dp2, the depth of the depletion region between the lower first epitaxial portion 1021 and the doping portion 104 increases. Although it is more difficult to form the doping portions 104, it may reduce the dimensions of the trench structure 105 (such as the width and depth of the trench structures 105 and the thickness of the insulating layer 1051) in the second epitaxial layer 1022 and reduce the cell pitch between adjacent semiconductor units. If the second depth dp2 is greater than the first depth dp1, the depth of the depletion region between the first epitaxial portion 1021 and the doping portions 104 is reduced, but it is beneficial to the formation of the doping portions 104.

The semiconductor devices of some embodiments have several advantages. In the above-mentioned embodiments, a device design that includes smaller cell pitch and narrower trench structures 105 for lower voltage operation can be applied with the doping portions 104 under the trench structures 105 to realize a semiconductor device suitable for high-voltage operation. In addition, the semiconductor device of the embodiments can effectively reduce the on-resistance. In addition, the doping portions 104 that are under the trench structures 105 are closer to the substrate 100 (i.e. functions as a drain region), in accordance with some embodiments of the present disclosure. When a high voltage is applied to the substrate 100, the doping portions 104 can reduce the electric field intensity at the bottoms of the insulating layers 1051 of the trench structures 105, thereby preventing formation of current leakage paths between the bottoms of the insulating layers 1051 and the substrate 100. Accordingly, the reliability of the semiconductor device can be improved.

In addition, according to some embodiments of the present disclosure, the conductive portions 1052 of the trench structures 105 can be electrically connected to the gate structures 110. For example, the conductive portions 1052 of the trench structures 105 can be electrically connected to the gate electrode 112 through the interconnections (not shown) in the semiconductor device. Alternatively, the conductive portion 1052 of the trench structures 105 can be electrically connected to the gate electrode 112 through pins that are provided on the conductive portion 1052, and then the electrical connection to the gate structure 110 can be completed by wire bonding during the packaging stage. In some embodiments, if the trench structures 105 are electrically connected to the gate electrodes in the subsequent process, the conductive portions 1052 of the trench structures 105 can reduce the on-resistance, and the conductive portions 1052 of the first conductivity type can further enhance the reduced surface electric field (RESURF) effect.

In addition, according to some embodiments of the present disclosure, the conductive portions 1052 of the trench structures 105 can be electrically connected to a source terminal. For example, the conductive portions 1052 of the trench structures 105 can be electrically connected to the first heavily doped portions 108 (source regions) and the contact plugs 116 (source contacts) through the interconnections (not shown) in the semiconductor device. Alternatively, the conductive portions 1052 of the trench structures 105 can be electrically connected to the first heavily doped portions 108 (source region) and the contact plugs 116 (source contacts) through pins that are coupled to the conductive portions 1052. Then, the electrical connection to the first heavily doped portions 108 and the contact plug 116 can be completed by wire bonding during the packaging stage.

According to the embodiments of the present disclosure, whether the trench structures 105 are electrically connected to the gate structures 110 or the source terminal, the on-resistance of the semiconductor device can be reduced.

In addition, the semiconductor devices of the embodiments are applicable to the circuit systems that are required for low-frequency operation or high-frequency operation through suitable circuit connection, depending on the requirements of electrical performances of the semiconductor devices. For example, in some embodiments that the conductive portion 1052 of the trench structure 105 is electrically connected to the gate structure 110, it generates a relatively high gate-to-drain capacitance (Cgd), but it has a relatively low on-resistance. Accordingly, the semiconductor device that has an electrical connection between the conductive portion 1052 and the gate structure 110 is generally suitable for the application of the circuit system that is designed for low frequency operation. In some other embodiments that the conductive portion 1052 of the trench structure 105 is electrically connected to the source terminal, it generates a relatively high on-resistance, but it has a relatively low gate-to-drain capacitance (Cgd) and a faster on-off switching speed. Accordingly, the semiconductor device that has an electrical connection between the conductive portion 1052 and the source terminal is generally suitable for the application of the circuit system that is designed for high frequency operation.

In addition, the semiconductor device of the embodiments can be selectively configured and flexibly designed depending on the practical requirements of the application. For example, a semiconductor structure may include several cells that are arranged on the substrate 100. In some embodiments, the conductive portions 1052 of the trench structures 105 of all these cells can be electrically connected to the source terminal or the gate structures 110. In some other embodiments, some conductive portions 1052 of the trench structures 105 of those cells are electrically connected to the source terminal, and the remaining conductive portions 1052 of the trench structures 105 are electrically connected to the gate structures 110. Accordingly, the semiconductor devices of the embodiments can be flexibly implemented in the applications.

In addition, several relative electrical simulations are conducted for investigate the electrical characteristics of a conventional semiconductor device and the semiconductor device of some embodiments. According to the simulation results, it can be proved that the semiconductor device of the embodiments does have effectively improved performance on the electrical characteristics. The electrical simulations are described below.

Figure 2:
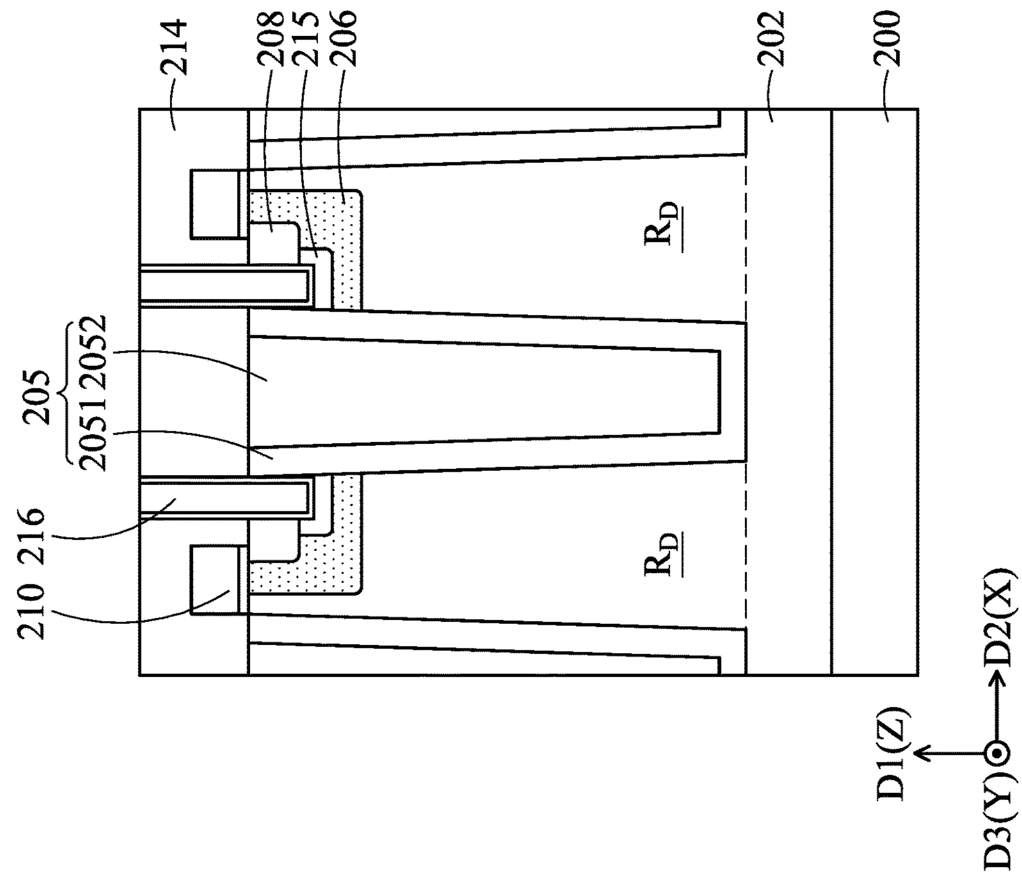
FIG. 2 is a cross-sectional view of a conventional semiconductor device.

FIG. 2 is a cross-sectional view of a conventional semiconductor device. The features/components in FIG. 2 similar or identical to the features/components in FIG. 1G are designated with similar or the same reference numbers, and the details of those similar or the identical features/components can be inferred by analogy with the related contents in the aforementioned descriptions.

conductive portion 1052. In these simulation experiments, the depth of the trench structures 205 in the epitaxial layer 202 is equal to the sum of the depth of the trench structures 105 and the depth of the doping portions 104 of the embodied semiconductor device (FIG. 1G). In FIG. 2, a conventional semiconductor device 20 further includes the well regions 206 of the second conductivity type (such as p-type), the first heavily doped portions 208 of the first conductivity type (such as n-type), the second heavily doped portions 215 of the second conductivity type (such as p-type), the gate structures 210 and the contact plugs 216. Details of the configurations, the materials and the manufacturing methods of the components in FIG. 2 are similar to the above-mentioned descriptions referring to FIG. 1A to FIG. 1G, and they will not be repeated here.

In these simulation experiments, several electrical simulation tests were performed on the semiconductor device of the embodiments shown in FIG. 1G and the conventional semiconductor device shown in FIG. 2.

Table 1 shows related dimensions of the semiconductor devices and the results of simulation tests when the semiconductor device of the embodiments (FIG. 1G) and a conventional semiconductor device (FIG. 2) have the same breakdown voltage of about 80 volts.

TABLE 1

| Dimensions | Conventional semiconductor device | Semiconductor device of an embodiment |
|---|---|---|
| Critical dimension of trench opening (trench CD)(um) | 1.2 | 0.6 |
| Depth of trench (um) | 4.5 | 2.2 |
| Thickness of the insulating layers in the trenches (Å) | 3600 | 1900 |
| Pitch of doping portions (um) | NA | 0.6 |
| Depth of doping portions (um) | NA | 2.5 |
| Critical dimension of mesa of the epitaxial layer (um) | 0.83 | 0.74 |
| Cell pitch (um) | 4.06 | 2.68 |

| | Electrical performance | | | |
|---|---|---|---|---|
| | Conventional semiconductor device | | Semiconductor device of an embodiment | |
| | Connection end of the conductive portions in the trenches | | | |
| | Gate electrode | Source electrode | Gate electrode | Source electrode |
| Threshold voltage (Vth)(V) | 1.74 | | 1.66 | |
| Characteristic on-resistance (Ron, sp)(m(Ω-mm$^2$) | 24.68 | 29.02 | 14.83 | 16.09 |
| Characteristic charge (Qg, sp)(nC/mm$^2$) | 17.10 | 3.22 | 18.75 | 5.20 |
| Figure of merit (FOM)(m(Ω-nC) | 421.93 | 93.33 | 278.02 | 83.65 |
| Breakdown voltage (BV)(V) | 80.08 | | 80.89 | |
| Electric field intensity at the insulating layers of the trenches at the breakdown voltage (MV/cm) | 2.88 | | 2.18 | |

In the semiconductor device 20 shown in FIG. 2, several trench structures 205 are formed in the epitaxial layer 202 that is grown on the substrate 200. Each of the trench structures 205 includes the insulating layer 2051 and the According to the simulation results, when both devices have the same breakdown voltage (for example, about 80V), the critical dimension (for example, in the second direction D2) of the mesa of the epitaxial layer of a conventional semiconductor device (FIG. 2) is slightly greater than the critical dimension of the mesa of the epitaxial layer of the embodied semiconductor device. However, the critical dimension of the trench openings (e.g., 0.6 μm) of the semiconductor device in the embodiment is only ½ of the critical dimension (e.g., 1.2 μm) of the trench opening of a conventional semiconductor device. In addition, the thickness of the insulating layer (e.g., a shield oxide layer) in the trench of the semiconductor device in the embodiment is about 53% of the thickness of the insulating layer in the trench of a conventional semiconductor device. According to the dimensions in Table 1, compared to the cell pitch (e.g., 4.06 μm) of a conventional semiconductor device, the cell pitch (e.g., 2.68 μm) of the semiconductor device of the embodiment is reduced by about 34%. In other words, more semiconductor units of the embodiments can be arranged in the same area.

If the critical dimension of the trenches (0.6 micron) and the thickness (1900 angstroms) of the insulating layer of the embodiment shown in Table 1 are used to form the trench structure 205 (as a field plate) of the conventional semiconductor in FIG. 2 (i.e. without any doping portion 104), the breakdown voltage of this conventional semiconductor device decreases and cannot reach 80V. For example, the breakdown voltage of this conventional semiconductor device may only be about 52V. Therefore, the device design that includes the trench structures and the doping portions can use a structural configuration (such as smaller cell pitch and narrower trench structures) with lower breakdown voltage to realize a semiconductor device with higher breakdown voltage, in accordance with some embodiments of the present disclosure.

In addition, according to the simulation results in Table 1, whether the trench structures are electrically connected to the gate structures or a source terminal, the on-resistance of the semiconductor device can be reduced. In an exemplary embodiment that the trench structures are electrically connected to the gate structures, the characteristic on-resistance (14.83 mΩ-mm$^2$) of the semiconductor device of the embodiment is greatly reduced by approximately 40%, compared to the characteristic on-resistance (24.68 mΩ-mm$^2$) of a conventional semiconductor device. In an exemplary embodiment that the trench structures are electrically connected to the source terminal, the characteristic on-resistance (16.09 mΩ-mm$^2$) of the semiconductor device of the embodiment is greatly reduced by approximately 44.5%, compared to the characteristic on-resistance (29.02 mΩ-mm$^2$) of a conventional semiconductor device.

In addition, whether it is the semiconductor device of the embodiment or a conventional semiconductor device, the trench structures that are electrically connected to the gate structures generate field plate effect, so its on-resistance is lower than that of the trench structures electrically connected to the source terminal. In addition, according to the results in Table 1, the characteristic on-resistance (i.e., 16.09 mΩ-mm$^2$) of the semiconductor device of the embodiment that includes the trench structures electrically connected to the source terminal is lower than the characteristic on-resistance (i.e., 24.68 mΩ-mm$^2$) of a conventional semiconductor device that includes the trench structures electrically connected to the gate structure. Accordingly, the semiconductor devices of the embodiments do effectively improve the on-resistance.

In addition, figure of merit (FOM) are generally used to evaluate the performance of the semiconductor devices. FOM is the product of the characteristic charges (Qg,sp; the required charges per unit area during when the capacitor is charged and discharged) and the characteristic on-resistance (Ron,sp). According to the simulation results in Table 1, whether the trench structures are electrically connected to the gate structures or the source terminal, the FOM of the semiconductor device of the embodiment is lower than the FOM of a conventional semiconductor device. In one example that the trench structures are electrically connected to the gate structures, the FOM (278.02 mΩ-nC) of the semiconductor device of the embodiment is significantly improved by about 34.1% compared to the FOM (421.93 mΩ-nC) of a conventional semiconductor device. In one example that the trench structures are electrically connected to the source terminal, the FOM (83.65 mΩ-nC) of the semiconductor device of the embodiment is improved by about 10.4% compared to the FOM (93.33 mΩ-nC) of a conventional semiconductor device.

In addition, the characteristic charge of the semiconductor device has considerable effect on the switching speed of the device. The larger the numerical value of the characteristic charge, the greater amount of charge per unit area required for the capacitor when it is charged and discharged, thereby decreasing the switching speed of the semiconductor device. Thus, the semiconductor devices with greater characteristic charge are suitable for being operated at low frequencies. The smaller the numerical value of the characteristic charge, the less amount of charge per unit area required for the capacitor when it is charged and discharged, thereby increasing the switching speed of the semiconductor device. Thus, the semiconductor devices with smaller characteristic charge are suitable for being operated at high frequencies. According to the simulation results in Table 1, compared to a conventional semiconductor device, the characteristic charge value of the semiconductor device of the embodiment only increases slightly. Therefore, the semiconductor device of the embodiment still has a good switching speed. In addition, compared to a conventional semiconductor device, the semiconductor device of the embodiments has advantages of greatly improving the characteristic on-resistance without sacrificing the characteristic charge.

In addition, when a semiconductor device in which current flows in a vertical direction (e.g., the substrate as the drain terminal) is operated at a high voltage, high electric field intensity at the bottom of the trench structures will damage the insulating layers of the trench structures. This will cause the current leakage or even a short circuit between the conductive portions of the trench structures and the substrate, thereby affecting the reliability of the semiconductor device. According to the simulation results in Table 1, when the embodied semiconductor device and a conventional semiconductor device have the same breakdown voltage (for example, about 80V), the electric field intensity (2.18 MV/cm) at the bottom of the insulating layers of the trench structures of the embodied semiconductor device is less than the electric field intensity (2.88 MV/cm) at the bottom of the insulating layers of the trenches of a conventional semiconductor device. The electric field strength at the bottom of the insulating layers of the trench structures of the embodied semiconductor device is improved by about 24.3%. According to the semiconductor devices of the embodiment, reduction of the electric field intensity can prevent the bottom of the insulating layers of the trench structures from damage, thereby solving the current leakage or short circuit problems that may occur in conventional semiconductor devices. Therefore, it is beneficial to improve the reliability of the semiconductor device.

Some Other Embodiments

In addition, according to the above-mentioned semiconductor device, as shown in FIG. 1G, the extending direction (for example, the third direction D3) of the doping portions 104 in the first epitaxial portion 1021 is the same as the extending direction (for example, the third direction D3) of the trench structures 105. The doping portions 104 may be pillars of the second conductivity type, such as p-type pillars. These-type pillars are separated from each other in the first epitaxial portion 1021 and extend in the same direction. However, arrangement of the doping portions 104 and the trench structures 105 of the present disclosure is not limited to the above configuration. The extending directions of the doping portions 104 and the trench structures 105 in the embodiment may be the same or different (for example, perpendicular to each other). In addition, the doping portions 104 of the embodiments are not limited to any particular shape.

The applicable arrangements of the doping portions 104 and the trench structures 105, in accordance with some embodiments (but not all embodiments), are described below.

Figure 3:
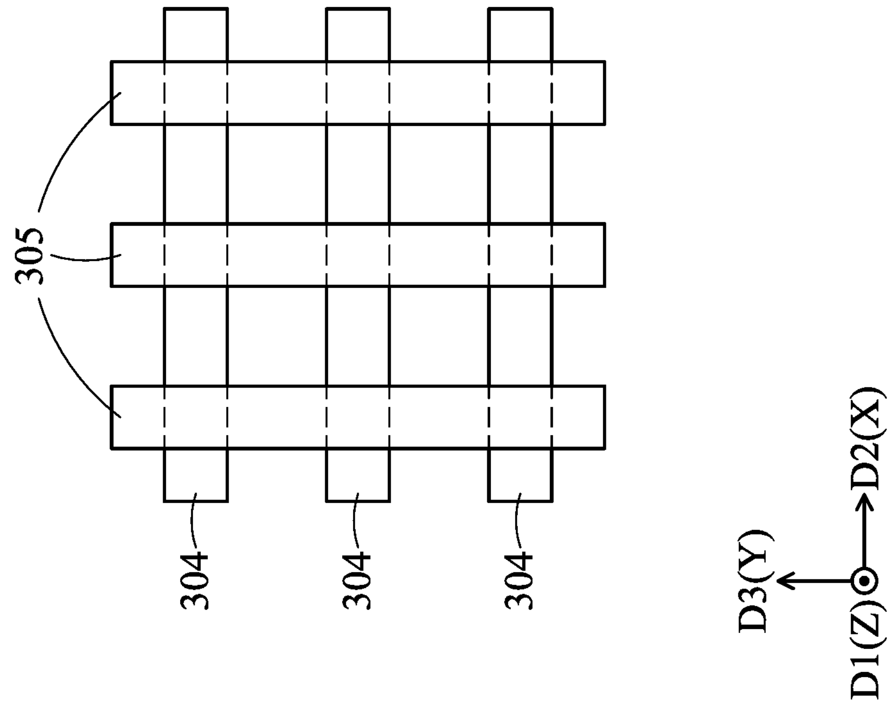
FIG. 3 is a schematic top view of doping portions and trench structures of a semiconductor device, in accordance with some embodiments of the present disclosure.

FIG. 3 is a schematic top view of doping portions and trench structures of a semiconductor device, in accordance with some embodiments of the present disclosure. In some embodiments, the extension directions of the doping portions 304 and the trench structures 305 are different. As shown in FIG. 3, the trench structures 305 of the embodiments are formed in the second epitaxial portion 1022 and extend in the third direction D3. The doping portions 304 of the embodiments are formed in the first epitaxial portion 1021 and extend in the second direction D2. The second direction D2 is perpendicular to the third direction D3.

In addition, in some other embodiments, the extension direction of the doping portions 104 and the extension direction of the trench structures 105 may have an included angle (not shown). The included angle may be in a range of greater than 0 degrees to less than 90 degrees.

In addition, the shape of the doping portions 104 of the present disclosure is not limited to the above-mentioned pillars of the second conductive type. The doping portions 104 can be formed in any shape. For example, the doping portions 104 can be island blocks of the second conductivity type. When viewed from the top of the epitaxial layer 102, the top surfaces of these island blocks can be, for example, rectangular, square, circular, elliptical, hexagonal, polygonal, rings, or another suitable shapes. The doping portions 104 of the embodiments are not limited to any particular shape.

Figure 4A:
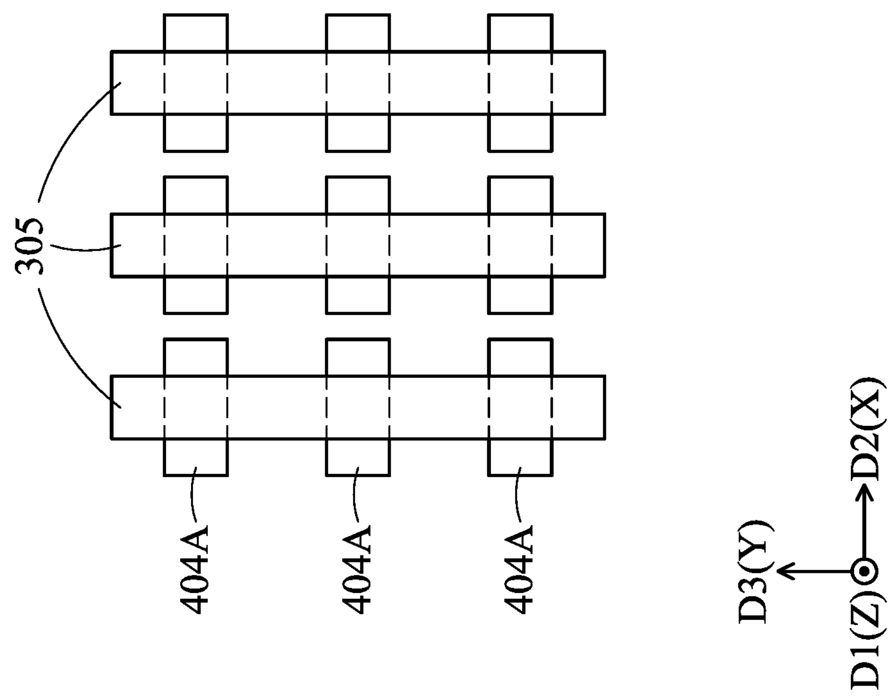
FIG. 4A to FIG. 4C are schematic top views of the doping portions and the trench structures of the semiconductor devices, in accordance with some embodiments of the present disclosure.
Figure 4C:
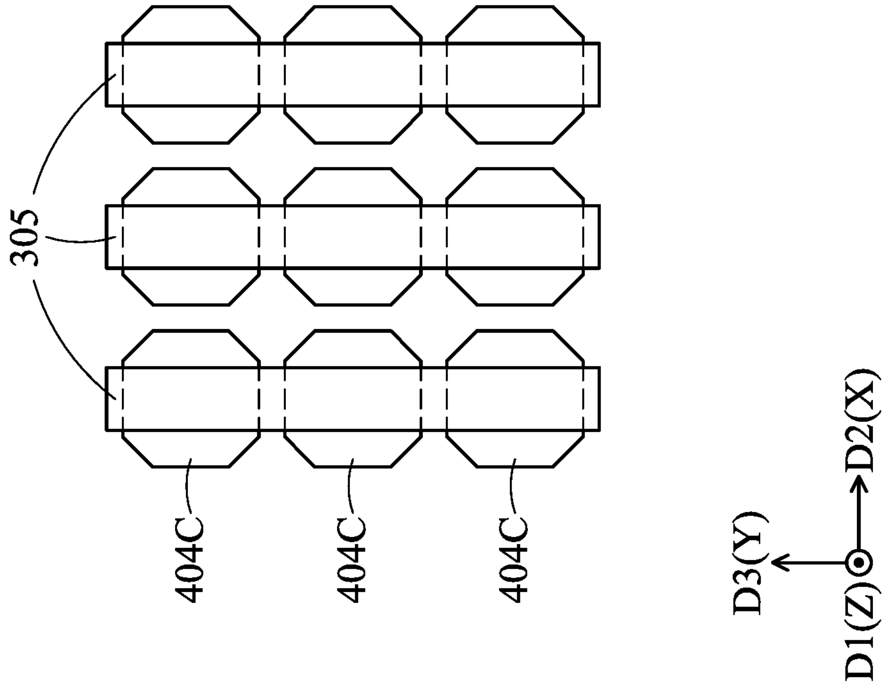
Figure 4B:
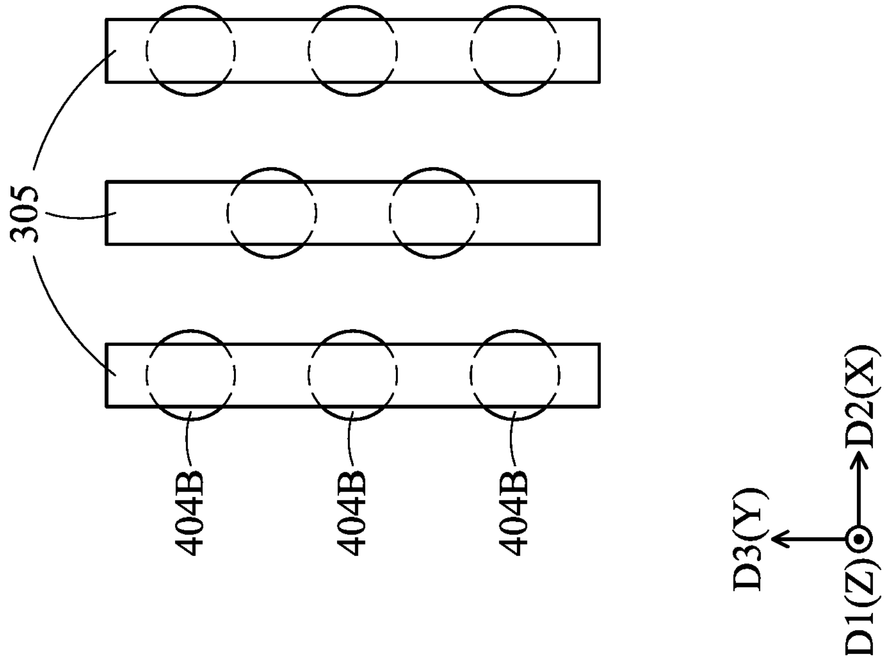

FIG. 4A to FIG. 4C are schematic top views of the doping portions and the trench structures of the semiconductor devices, in accordance with some embodiments of the present disclosure. As shown in FIG. 4A to FIG. 4C, the doping portions 404A, 404B and 404C are island blocks of the second conductivity type. These island blocks are separated from each other in the first epitaxial portion 1021, and the bottom of each of the trench structures 305 may be in contact with one or more island blocks. In addition, the island blocks that correspond to adjacent trench structures 305 may be arranged in multiple rows or staggered from each other.

As shown in FIG. 4A, in some embodiments, the doping portions 404A are island blocks that have rectangular top surfaces and are separated from each other in the first epitaxial portion 1021. The bottom surface of each of the trench structures 305 is in contact with two or more doping portions 404A.

As shown in FIG. 4B, in some embodiments, the doping portions 404B are island blocks that have circular top surfaces and are separated from each other in the first epitaxial portion 1021. The bottom surface of each of the trench structures 305 is in contact with two or more doping portions 404B.

As shown in FIG. 4C, in some embodiments, the doping portions 404C are island blocks that have hexagonal top surfaces and are separated from each other in the first epitaxial portion 1021. The bottom surface of each of the trench structures 305 is in contact with two or more doping portions 404C.

Figure 5:
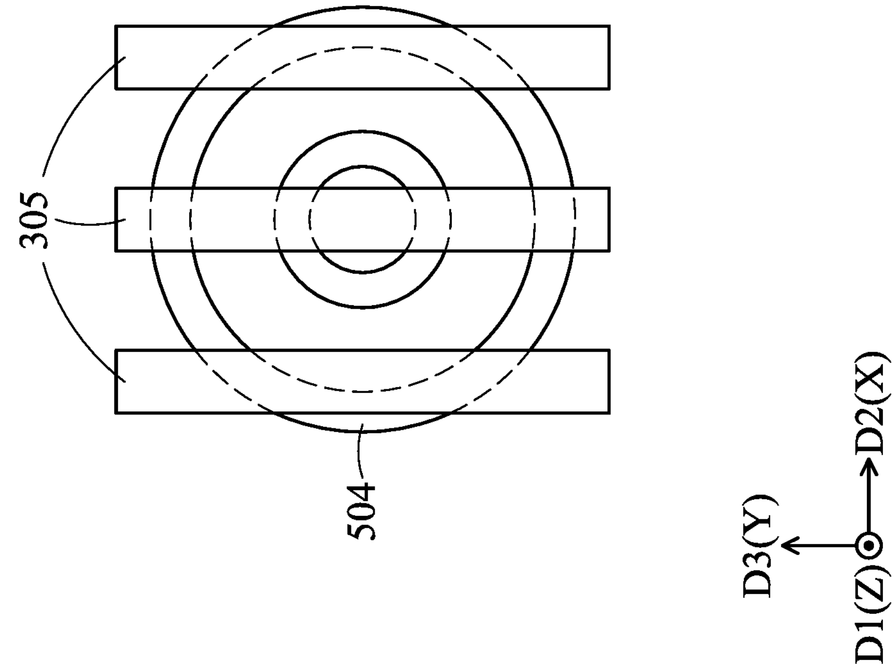
FIG. 5 is a schematic top view of doping portions and trench structures of a semiconductor device, in accordance with some embodiments of the present disclosure.

FIG. 5 is a schematic top view of doping portions and trench structures of a semiconductor device, in accordance with some embodiments of the present disclosure. As shown in FIG. 5, in some embodiments, the doping portions 504 are hollow tubes of the second conductivity type. The hollow tubes that are formed in the first epitaxial portion 1021 have annular-shaped top surfaces. The bottom surfaces of the trench structures 305 are in contact with parts of the doping portions 504. In addition, the doping portions 504 may be arranged in a concentric configuration.

Details of the configurations, the materials and the manufacturing methods of the doping portions 304, 404A, 404B, 404C and the trench structures 305 are similar to the doping portions 104 and the trench structures 105 in the above-mentioned descriptions referring to FIG. 1A to FIG. 1D. The contents will not be repeated herein.

According to the aforementioned descriptions, the semiconductor devices in accordance with some embodiments of the present disclosure have many advantages. For example, a device design for lower voltage operation (such as smaller cell pitch and narrower trench structures) can be incorporated with the doping portions under the trench structures to realize a semiconductor device suitable for high-voltage operation. Thus, more semiconductor units can be integrated in the same area, in accordance with some embodiments of the present disclosure. In addition, the semiconductor devices of the embodiments can effectively reduce the on-resistance, thereby improving the electrical performance of the semiconductor devices. In addition, the doping portions of the embodiments can reduce the electric field intensity at the bottoms of the insulating layers of the trench structures, thereby preventing formation of current leakage paths or short circuit between the bottoms of the insulating layers and the substrate. Accordingly, the reliability of the semiconductor devices of the embodiments can be improved. In addition, the method for forming the semiconductor device, in accordance with some embodiments of the present disclosure, can produce a semiconductor device with doping portions in the lower portion of the epitaxial layer through a simple process. For example, it only requires one additional mask for forming the doping portions of the semiconductor device, in accordance with some embodiments of the present disclosure. The method for forming the semiconductor device of the embodiments is compatible with the existing processes. Accordingly, the methods of forming the semiconductor device, in accordance with some embodiments of the present disclosure, do not include complicated and expensive manufacturing processes, which save production time for fabricating the semiconductor device and do not increase the manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   - a substrate that has a first conductivity type;
   - an epitaxial layer on the substrate, wherein the epitaxial layer has the first conductivity type, and the epitaxial layer comprises:
     - a first epitaxial portion on the substrate; and
     - a second epitaxial portion on the first epitaxial portion;
   - doping portions that are formed in the first epitaxial portion, wherein the doping portions have a second conductivity type;
   - a trench structure that is formed in the second epitaxial portion, wherein the trench structure extends from a top surface of the second epitaxial portion into the second epitaxial portion, the trench structure comprises a conductive portion and an insulating layer that covers sidewalls and a bottom of the conductive portion, and the insulating layer is in contact with one of the doping portions;
   - a well region that extends from the top surface of the second epitaxial portion into the second epitaxial portion, wherein the well region has the second conductivity type, and a first sidewall of the well region is in contact with the trench structure, and a bottom surface and a second sidewall opposite to the first sidewall of the well region are in contact with the second epitaxial portion; and
   - a gate structure that is formed on the top surface of the second epitaxial portion and over the well region.

2. The semiconductor device as claimed in claim 1, wherein the conductive portion of the trench structure is separated from the doping portion by the insulating layer of the trench structure.

3. The semiconductor device as claimed in claim 1, wherein top surfaces of the doping portions are coplanar with a top surface of the first epitaxial portion.

4. The semiconductor device as claimed in claim 1, wherein a bottom surface of the conductive portion of the trench structure is lower than the bottom surface of the well region, and the bottom surface of the conductive portion is higher than a top surface of the first epitaxial portion.

5. The semiconductor device as claimed in claim 1, wherein a doping concentration of the doping portions that are formed in the first epitaxial portion is equal to a doping concentration of the first epitaxial portion.

6. The semiconductor device as claimed in claim 1, further comprising:
   - a first heavily doped portion that is formed in the well region and extends downward from the top surface of the second epitaxial portion into the second epitaxial portion, and the first heavily doped portion has the first conductive type,
   - wherein a doping concentration of the doping portions in the first epitaxial portion is lower than a doping concentration of the first heavily doped portion.

7. The semiconductor device as claimed in claim 6, further comprising:
   - a second heavily doped portion that is formed in the well region and adjacent to the trench structure, and the second heavily doped portion has the second conductivity type,
   - wherein the doping concentration of the doping portions provided in the first epitaxial portion is lower than a doping concentration of the second heavily doped portion.

8. The semiconductor device as claimed in claim 1, wherein a ratio of a depth of the doping portions in the first epitaxial portion to a depth of the trench structure in the second epitaxial portion is in a range of 0.5 to 1.5.

9. The semiconductor device as claimed in claim 1, wherein a ratio of a depth of the doping portions in the first epitaxial portion to a thickness of the first epitaxial portion is in a range of 0.4 to 0.9.

10. The semiconductor device as claimed in claim 1, wherein an extension direction of the doping portions in the first epitaxial portion is the same as an extension direction of the trench structure in the second epitaxial portion.

11. The semiconductor device as claimed in claim 1, wherein an extension direction of the doping portions in the first epitaxial portion is different from an extension direction of the trench structure in the second epitaxial portion.

12. The semiconductor device as claimed in claim 1, wherein the doping portions are pillars of the second conductivity type, and the pillars are separated from each other in the first epitaxial part and extend in the same direction.

13. The semiconductor device as claimed in claim 12, wherein a width of a bottom surface of the trench structure is less than a width of a top surface of the pillar that is in contact with the trench structure.

14. The semiconductor device as claimed in claim 1, wherein the doping portions are island blocks that have the second conductivity type, and the island blocks that are formed in the first epitaxial portion are separated from each other,
   - wherein a bottom of the trench structure is in contact with two or more of the island blocks.

15. The semiconductor device as claimed in claim 14, wherein a top surface of each of the island blocks has a shape that is a rectangle, a square, a circle, an ellipse, a hexagon or another polygon when viewed from a top of the epitaxial layer.

16. The semiconductor device as claimed in claim 1, wherein the doping portions are hollow tubes that have the second conductivity type, and the hollow tubes that are positioned in the first epitaxial portion have annular-shaped top surfaces.

17. The semiconductor device as claimed in claim 1, wherein the conductive portion of the trench structure is electrically connected to a source terminal of the semiconductor device.

18. The semiconductor device as claimed in claim 1, wherein the conductive portion of the trench structure is electrically connected to the gate structure.

19. A method for forming a semiconductor device, comprising:
   - providing a substrate that has a first conductivity type;
   - forming a first epitaxial portion on the substrate, wherein the first epitaxial portion has the first conductivity type;
   - forming doping portions in the first epitaxial portion, wherein the doping portions have a second conductivity type, and the doping portions extend downward from a top surface of the first epitaxial portion into the first epitaxial portion;
   - forming a second epitaxial portion on the first epitaxial portion, wherein the second epitaxial portion has the first conductivity type, and the first epitaxial portion and the second epitaxial portion form an epitaxial layer;

forming a trench structure in the second epitaxial portion, wherein the trench structure extends downward from a top surface of the second epitaxial portion and is in contact with one of the doping portions, wherein the trench structure includes a conductive portion and an insulating layer that covers sidewalls and a bottom of the conductive portion, and the insulating layer is in direct contact with the one of the doping portions;

forming a well region that extends downwardly from the top surface of the second epitaxial portion into the second epitaxial portion, and the well region has the second conductivity type, wherein a first sidewall of the well region is in contact with the trench structure, and a bottom surface and a second sidewall of the well region that is opposite to the first sidewall are in contact with the second epitaxial portion; and forming a gate structure on the top surface of the second epitaxial portion, wherein the gate structure is positioned above the well region.

20. The method for forming a semiconductor device as claimed in claim 19, wherein the doping portions are formed after forming the first epitaxial portion and before forming the second epitaxial portion.

21. The method for forming a semiconductor device as claimed in claim 19, wherein forming the doping portions comprises:

forming a mask on the first epitaxial portion, wherein the mask includes a pattern corresponding to positions of the doping portions;

performing an ion implantation process on the first epitaxial portion through the pattern of the mask to form doping regions in the first epitaxial portion, wherein the doping regions include dopants of the second conductive type; and performing a thermal drive-in process to diffuse the dopants in the doping regions outwardly to form the doping portions.

22. The method for forming a semiconductor device as claimed in claim 19, wherein forming the doping portions comprises:

forming holes in the first epitaxial portion, wherein the holes extend downwardly from the top surface of the first epitaxial portion into the first epitaxial portion; and filling the holes with a material of the second conductivity type to form the doping portions.

23. The method for forming a semiconductor device as claimed in claim 19, wherein the doping portions and the first epitaxial portion include the same semiconductor material.

24. The method for forming a semiconductor device as claimed in claim 19, wherein the conductive portion of the trench structure is electrically isolated from the one of the doping portions that is in contact with the conductive portion by the insulating layer of the trench structure.

25. The method for forming a semiconductor device as claimed in claim 19, wherein a doping concentration of the doping portions that are formed in the first epitaxial portion is equal to a doping concentration of the first epitaxial portion.

26. The method for forming a semiconductor device as claimed in claim 19, wherein a ratio of a depth of the doping portions that are formed in the first epitaxial portion to a depth of the trench structure that is formed in the second epitaxial portion is in a range of 0.5 to 1.5.

27. The method for forming a semiconductor device as claimed in claim 19, wherein before the gate structure is formed, the method further comprises:

doping the well region from the top surface of the second epitaxial portion to form a first heavily doped portion, wherein the first heavily doped portion has the first conductivity type, and a doping concentration of the first heavily doped portion is greater than a doping concentration of the doping portions, and wherein the gate structure is positioned over the first heavily doped portion.

28. The method for forming a semiconductor device as claimed in claim 27, wherein after the gate structure is formed, the method further comprises:

forming an interlayer dielectric layer on the top surface of the second epitaxial portion, wherein the interlayer dielectric layer covers the gate structure, the first heavily doped portion and the trench structure;

removing a portion of the interlayer dielectric layer, a portion of the first heavily doped region and a portion of the well region to form a contact hole, wherein a bottom of the contact hole exposes the well region;

forming a second heavily doped portion under the contact hole by doping the well region through the contact hole, wherein the second heavily doped portion has the second conductivity type, and a doping concentration of the doping portions formed in the first epitaxial portion is lower than a doping concentration of the second heavily doped portion; and forming a contact plug in the contact hole, wherein the contact plug is formed between the gate structure and the trench structure, and a bottom portion of the contact plug is in contact with the second heavily doped portion.

* * * * *